United States Patent [19]

Haragashira et al.

[11] Patent Number: 4,954,924

[45] Date of Patent: Sep. 4, 1990

[54] SWITCH FOR HIGH MAGNETIC FIELD

[75] Inventors: Motoji Haragashira, Tochigi; Yoshimi Maekawa, Kawasaki, both of Japan

[73] Assignee: Kabushiki Kaisha Toshiba, Kawasaki, Japan

[21] Appl. No.: 271,833

[22] Filed: Nov. 16, 1988

[30] Foreign Application Priority Data

Nov. 18, 1987 [JP] Japan ................. 62-289402

[51] Int. Cl.$^5$ ............................. H01H 9/00
[52] U.S. Cl. ................. 361/187; 335/131; 335/185; 361/142
[58] Field of Search ............. 335/131, 132, 185, 189, 335/190; 361/142, 170, 186, 187

[56] References Cited

U.S. PATENT DOCUMENTS

| | | | |
|---|---|---|---|
| 3,319,199 | 5/1967 | Bauer | 335/185 |
| 4,631,507 | 12/1986 | Guery et al. | 335/189 |
| 4,658,226 | 4/1987 | Maenishi et al. | 335/190 |
| 4,725,801 | 2/1988 | Snyder | 335/190 |
| 4,752,755 | 6/1988 | Nakano et al. | 335/6 |

OTHER PUBLICATIONS

J. F. Shen, et al., *R.F. Coil Design for NMR Imaging*, "Society of Magnetic Resonance in Medicine", 4th Annual Meeting, Aug. 1985, pp. 1117-1118.

*Primary Examiner*—A. D. Pellinen
*Assistant Examiner*—Jeffrey A. Gaffin
*Attorney, Agent, or Firm*—Foley & Lardner, Schwartz, Jeffery, Schwaab, Mack, Blumenthal & Evans

[57] ABSTRACT

A switch is mounted in a housing of a high-intensity static magnetic field generator and the housing includes a rotation shaft supported on the housing, a coil mounted relative to rotation shaft, an arm energized by the coil, arm energized by that arm, a rod energized by the arm, a latching/snapping element energized by the rod, a rod moved by the element and a movable electrode plate energized by the rod and movable into and out of engagement with a fixed electrode plate and holding their engaged and disengaged states. Almost every member of the switch is made of non-magnetic material, such as plastics and copper. Upon driving the coil under a mutual electromagnetic atmosphere resulting from electric current in the coil and high magnetic field Bo of the high-intensity static magnetic field generator, the element can open and close an associated electric circuit, while performing a latching/snapping operation, which is included in the high-intensity static magnetic field generator connected to the fixed electrode plate. It is also possible to hold the opened and closed states.

13 Claims, 4 Drawing Sheets

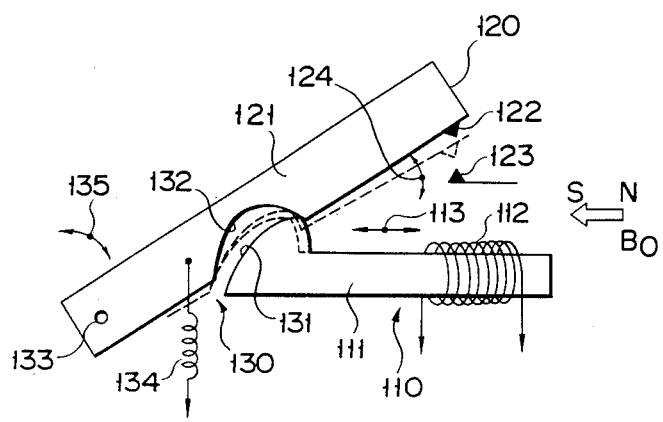
F I G. 2
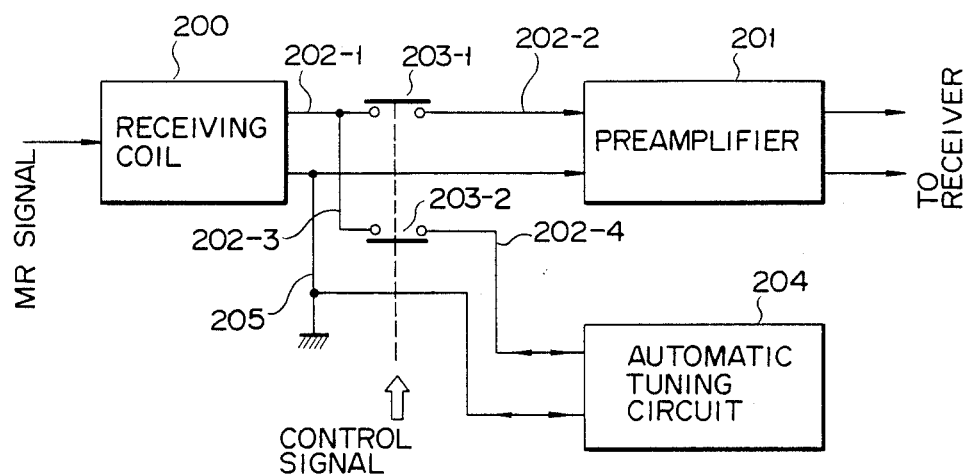
F I G. 3

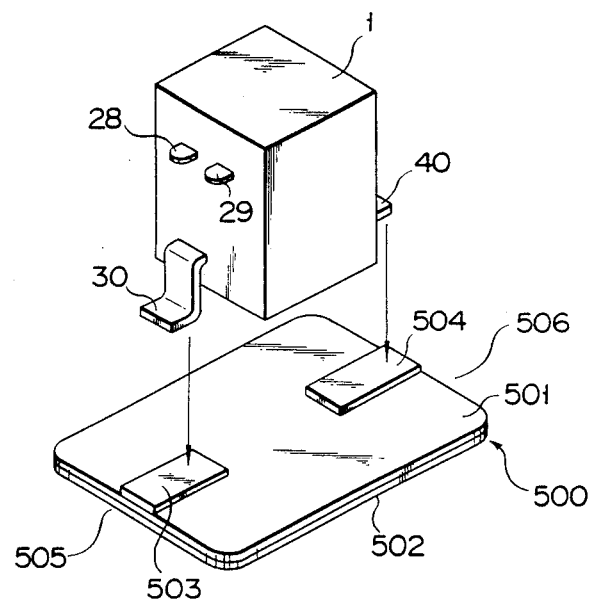
F I G. 6

SWITCH FOR HIGH MAGNETIC FIELD

BACKGROUND OF THE INVENTION

1. Field of the Invention

The present invention relates to a switch for use in a high magnetic field which is generated from a high magnetic field generator, such as a magnetic resonance imaging apparatus.

2. Description of the Related Art

A known magnetic resonance imaging apparatus uses a high-intensity static magnetic field generator including either one or a combination of a super-conducting magnet, resistive magnet and permanent magnet. The high-intensity static magnetic field generator is adapted to generate thousands to tens of thousands of magnetic field within a spherical space some tens in diameter in a stable fashion over a length of time. The direction of such high-intensity static magnetic field is substantially constant within the space.

In a medical magnetic resonance imaging apparatus using this type of high-intensity static magnetic field apparatus, a switch is sometimes located within the high-intensity static magnetic field apparatus, as will be set forth below by way of example. The general medical magnetic resonance imaging apparatus comprises a high-intensity static magnetic field generator, transmitting and receiving system, field gradient generation system, control system and signal processing system. The transmitting and receiving system comprises, as main elements, transmitting coil, receiving coil, a transmit/receive coil (i.e., a single coil) and a plurality of high frequency transmission paths and is located substantially within the high-intensity static magnetic field generator. One or more switches are assembled for some main elements and an assembly thus obtained is associated with, for example, a plurality of capacitors in the aforementioned coil to allow a switching to be made among a corresponding number of the high frequency transmission paths. In this way it is possible to improve the transmission/reception characteristics and select a desirable atomic nucleus, an object to be imaged.

The characteristics of the aforementioned switch are of such a type that it is possible to reliably open or close an associated circuit located as close to the coil as possible and to maintain that state. In this case, the coil needs to be located below the high magnetic field atmosphere, that is substantially within the high-intensity static magnetic field generator.

As a general candidate switch use may be made of, for example, an electromagnetic relay, that is a switch capable of opening and closing the associated contact by remote control. However, the aforementioned electromagnetic relay suffers various restrictions regarding its installation.

For example, the first restriction is that the operation of the switch is affected by the high-intensity static magnetic field which is generated from the high-intensity static magnetic field generator. The second restriction is that uniformity is not disturbed in the high-intensity static magnetic field due to the use of the switch. The third restriction is that a subject (sample) can be positioned in not too narrow a space in spite of providing the switch in the high-intensity static magnetic field generator.

The third restriction presents no problem because an inexpensive, adequately compact, easy-to-handle electromagnetic relay can readily be obtained irrespective of the size of a current capacity. The second restriction, on the other hand, may disturb the high-intensity static magnetic field due to the presence of an associated electromagnetic actuator, support member, etc., which are made of ferromagnetic material and incorporated into the electromagnetic relay. The first restriction presents a problem because the aforementioned electromagnetic actuator, support member, etc., may induce an operation error, or not operate at all, due to an action of an electromagnetic force resulting from the high-intensity static magnetic field applied.

With this in view, it may be difficult to mount, in place, and use this type of electromagnetic relay under the aforementioned high-intensity static magnetic field atmosphere. As a consequence, this type of electromagnetic relay has to be placed in a specific position below a low magnetic field atmosphere of several gausses, that is, in a position greatly remote from the coil. It is, therefore, impossible to either obtain the desirable receive characteristics due to a transmission loss responsible for an extension of a cable from the receiving coil to the preamplifier, or to select the type of the atomic nucleus, an object to be imaged, under a preferable condition.

SUMMARY OF THE INVENTION

It is accordingly the object of the present invention to provide a switch which can close or open an associated electric circuit under a high magnetic field atmosphere and positively hold that open and a closed state.

The aforementioned object of the present invention can be achieved by a switch capable of being used under a high magnetic field induced in a high magnetic field generator including at least one circuit to be switched, which comprises driving means including at least a coil and a non-magnetic element, which are reversibly movable, under a mutual electromagnetic atmosphere obtained by flowing electric current in the coil and the high magnetic field, opening/closing means having a movable contact and a fixed contact, for closing the circuit by connecting the movable contact to the fixed contact, and opening the circuit by the movable contact separate from the fixed contact, and transmitting means located between the driving means and the opening/closing means for transmitting an driving force of said driving means to said opening/closing means to latch the movable and fixed contacts.

BRIEF DESCRIPTION OF THE DRAWINGS

FIG. 2 is a plan view showing a switch according to the second embodiment of this invention;

FIG. 3 is a block diagram showing one practical from of the switch of the present invention which is incorporated into a receiving means of a magnetic resonance imaging apparatus;

FIG. 6 is a perspective view showing a coaxial switch including a third practical form of the switch of the present invention.

DETAILED DESCRIPTION OF THE PREFERRED EMBODIMENTS

A switch for a high magnetic field according to an embodiment of the present invention will be explained below with reference to the accompanying drawings.

Figure 1:
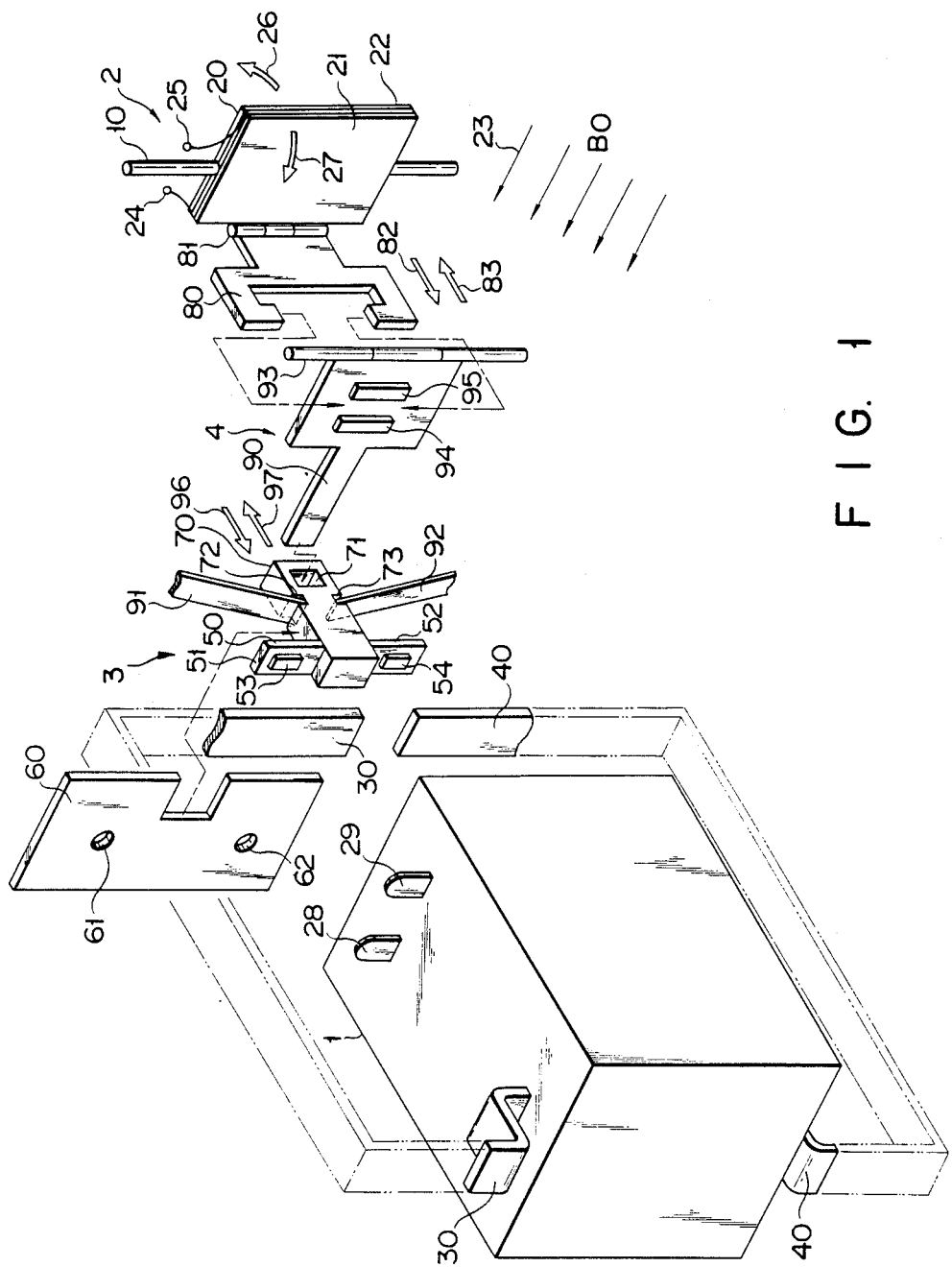
FIG. 1 is a perspective, exploded view showing a switch for use in a high magnetic field, according to the first embodiment of the present invention.

In FIG. 1, rectangular housing 1 made of non-magnetic material is located substantially within a high magnetic field generator, not shown. The high magnetic field generator is constituted by a high-intensity static magnetic field generator which is typically employed for a magnetic resonance imaging apparatus. Housing 1 is placed under an atmosphere of a high magnetic field Bo, which is generated by the high magnetic field generator, and includes driving member 2, opening/closing member 3 and transmitting member 4.

These members 2, 3 and 4 will be explained below in more detail.

Driving member 2 comprises rotation shaft 10 and coil 20; opening/closing member 3 comprises fixed electrode plates 30, 40, movable electrode plate 50, grounded electrode plate 60 and rod 70; and transmitting member 4 comprises arms 80 and 90; and latching/snapping elements 91 and 92.

Rotation shaft 10 of driving member 2 is mounted within housing 1 such that both ends of rotation shaft 10 are rotatably supported on the corresponding wall faces of housing 1. Coil 20 is fixed to the substantially intermediate portion of rotation shaft 10 and turned around the outer wall face of plate 21. Coil 20 is not arranged as to generate a flux in a direction perpendicular to the axial direction of rotation shaft 10. Since a high magnetic field Bo is created in a direction indicated by arrow 23 in FIG. 1, driving member 2 is rotated, upon the flow of electric current in coil 20 across terminals 24 and 25, in a direction of arrow 26 or 27 in FIG. 1 with rotation shaft 10 as a rotation axis. The rotation operation is caused by a mutual electromagnetic force which is developed due to electric current in coil 20 and the aforementioned high magnetic field Bo. Housing 1 includes control signal terminals (28, 29) which are electrically connected to corresponding terminals (24, 25).

One end of arm 80 is operably connected to the side edge of coil 20 by hinge 81, and, upon the rotation of coil 20 in the direction of arrow 26 in FIG. 1, arm 80 is operated in a linear fashion in the direction of arrow 82 in FIG. 1. Upon the rotation of coil 20 in the direction of arrow 27 in FIG. 1, arm 80 is moved in a linear fashion in the direction of arrow 83 in FIG. 1. Hinge 93 is provided at one end of arm 90 and projections 94 and 95 are provided on arm 90. Arm 80 has a substantially C-shaped recess in which it is held in place between projections 94 and 95 of arm 90. The other end of arm 90 is fitted into recess 71 which is formed in rod 70. Thus the motion of arm 80 in the direction of arrows in FIG. 1 is transmitted in the direction of arrow 96 or 97 such that it is amplified due to the action of leverage. Rod 70 has grooves 72 and 73 on the corresponding side sections and the base ends of latching/snapping elements 91 and 92 are fitted into grooves 72 and 73, noting that the latching/snapping elements are made of substantially nonmagnetic leaf spring. The latching/snapping elements 91 and 92 are fixed at the other ends to the inner wall of housing 1. Upon the movement of rod 70 in the direction of arrow 96 or 97 in FIG. 1 the latching/snapping element are bent due to their firm structure. For this reason, the motion of rod 70 in the direction of arrow 96 or 97 is such that it is held at the lowest position (a limit position as viewed in the direction of arrow 96) and at the uppermost position (a latching position). This holding position is released by moving rod 70 in the direction of arrow 97 or 96 in FIG. 1. Upon a manual push of plate 21 in the direction of arrow 26 or 27 in FIG. 1 by means of, for example, a rod (not shown) it is possible to manually make the aforementioned holding and releasing operations.

Movable electrode plate 50 is mounted partway of, and on the lower side of, rod 70 in a direction substantially perpendicular to rod 70. Movable electrode plate 50 is made up of first and second movable electrode plates 51 and 52. High conductivity metals 53 and 54, such as silver and gold, are mounted opposite to fixed electrode plates 30 and 40, and grounded electrode plate 60 is disposed relative to that face opposite to that contact face of fixed electrode plates 30, 40. Grounded electrode plate 60 and fixed electrode plates 30, 40 are so arranged that upon the movement of movable electrode plates 51, 52 a predetermined distance apart from fixed electrode plates 30, 40 movable electrode plates 51, 52 are moved into face contact with grounded electrode plate 60. Conductor wires, not shown, such as lead wires, are connected at one end to terminals 61 and 62 and at the other end to a ground terminal. Grounded electrode plate 60 are grounded in the open-circuited state, serving to enhance an isolation between fixed electrode plates 30 and 40.

In terms of the material used for the switch, almost every member is made of nonmagnetic material, such as plastics and copper, and the arrangement of the respective members are shown by dash dot lines in FIG. 1, and electrode plates 30, 40 are shown by dash two dots line in FIG. 1.

The operation of the switch will be explained below.

When electric current flows across terminals 28 and 29, driving member 2 is rotatably moved in the direction of arrow 26 or 27 in FIG. 1, causing arm 80 to be linearly moved in the direction of arrow 82 or 83 in FIG. 1. Upon receipt of a force resulting from the linear movement, latching/snapping elements 91 and 92 are moved in a latching/snapping fashion to cause rod 70 to linearly move in an amplified fashion in the direction of arrow 96 or 87 in FIG. 1. As a result, movable electrodes 51, 52 are moved into contact with fixed electrode plates 30, 40 and held at that "contact" state and away from plates 30, 40 and held at that "not contact" state.

According to the present invention, the electric circuit which is connected to fixed electrode plates 30, 40 can be opened or closed under the atmosphere, or through the utilization of, a static magnetic field Bo and be held in the open state or in the closed state.

If, in this case, a pulse-like electric current flows across terminals, driving member 2 may sometimes, after being rotated in the direction of, for example, arrow 26 in FIG. 1, be immediately rotated under a reaction force back into the original state, but a predetermined open or closed state is held by the latching/snapping action of latching/snapping elements 91 and 92. That is, the aforementioned predetermined open or closed state is held without involving a non-pulsatory electric current.

Since almost every member is made of the non-magnetic material (plastics, copper, etc.), the respective members per se as well as their operations are, under the atmosphere of high magnetic field Bo, not subjected to an influence from the aforementioned high magnetic field Bo. It is, therefore, impossible to obtain a reliable open/close operation.

A switch according to second embodiment of the present invention will be explained below with reference to FIG. 2. As shown in FIG. 2, the switch driving member 110, opening/closing member 120 and transmitting member 130 are incorporated in a housing, not shown, which is disposed, for example, within the high-intensity static magnetic field apparatus of the aforementioned magnetic resonance imaging apparatus.

Driving member 110 comprises first non-magnetic rod 111 and solenoid coil 112 fixed to the rod and opening/closing member 120 comprises second non-magnetic rod 121, movable contact 122 and fixed contact 123. Transmitting member 130 comprises projection 131, recess 132, pin 133 and tension spring 134.

The respective members 110, 120 and 130 are explained below in more detail. First non-magnetic rod 111 has projection 131 at one end and solenoid coil 112, at the other end portion, which is turned around rod 111 along the axial direction. First non-magnetic rod 111 is linearly movable in the direction of arrow 113 in which case the axial direction of first non-magnetic rod 111 aligns with the direction of a static magnetic field Bo which is developed from the high-intensity static magnetic field generator.

Second non-magnetic rod 121 includes recess 132 which is formed partway of its length. Recess 132 is associated with projection 131 to allow the latter to be fitted into the former. Pin 133 is provided at one end portion of second non-magnetic rod 121 and made of non-magnetic material. Second non-magnetic rod 121 is rotatably movable in the direction of arrow 135 in FIG. 135 and has tension spring 134 mounted thereon, tension spring 134 being made of non-magnetic material. By so doing, a tension force is exerted upon second non-magnetic rod 121. Movable contact 122 made of non-magnetic material is provided on the other end portion of second non-magnetic rod 121. Movable contact 122 is moved into engagement with, or away from, fixed contact 123 in a direction of arrow 124 in FIG. 2.

The operation of the switch will be explained below.

Coil 112 provides an air-core magnet when electric current flows through coil 112 so that an attractive or a repulsive force acts on that magnetic under the static magnetic field Bo and on first non-magnetic rod 111.

Let it be assumed that the initial state is as indicated by the solid line in FIG. 2 in which case a tip portion of projection 131 rides on the edge of recess 132 and hence contact 122 is opened relative to contact 123.

Upon the flow of electric current through coil 112, first non-magnetic rod 111 is moved to the left of the drawing sheet (FIG. 2), causing projection 131 to slide into the interior of recess 132 as indicated by the broken line in FIG. 2 so that contact 122 is closed relative to contact 123. In this case, contacts 122 are held, by the latching operation, in the closed state. In order to disengage the latching operation it is only necessary to move first non-magnetic rod 112 to the right of the drawing sheet (FIG. 2) by flowing electric current through coil 112.

According to the aforementioned second embodiment, it is possible to open and close the associated electric circuit even under a high magnetic field atmosphere, while making a latching operation, and to positively hold the "open" and "closed" states.

A suitable form of the switch of the present invention will be explained below.

FIG. 3 is a block diagram showing the suitable form of the switch as incorporated into a reception means of the magnetic resonance imaging apparatus. Receiving coil 200 is connected to preamplifier 201 respectively through signal line 202-1, switch (the present invention) 203-1 and signal line 202-2. Receiving coil 200 is connected to automatic tuning circuit 204 respectively through signal line 202-3, switch 203-2 and signal line 202-4. Reference numeral 205 shows a ground line.

In this case, switches 203-1 and 203-2 are arranged in proximity to receiving coil 200 which is located within the high-intensity static magnetic field apparatus of the magnetic resonance imaging apparatus.

Upon applying control signals to switches (the present invention) 203-1 and 203-2 switch 203-1 is closed and switch 203-2 is opened. As a result, an MR (magnetic resonance) signal is picked up by receiving coil 200 and supplied to a receiver via preamplifier 201.

With switch 203-1 opened and switch 203-2 closed, receiving coil 200 can be automatically tuned by automatic tuning circuit 204.

Figure 4:
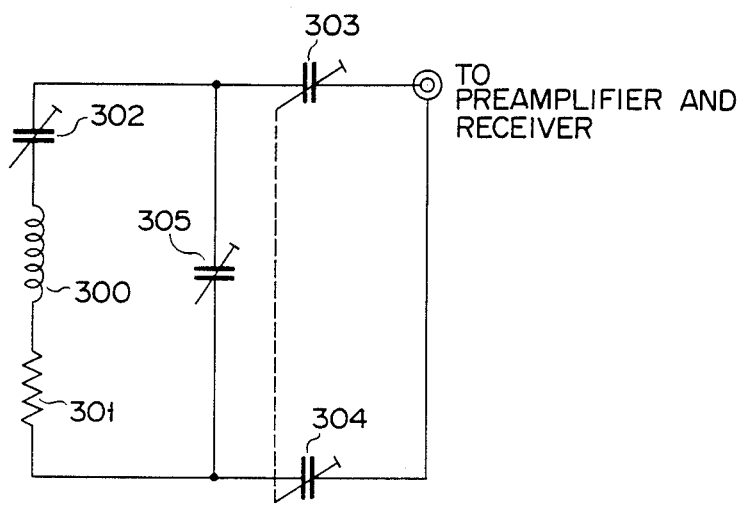
FIG. 4 is a circuit diagram showing a second practical form of the switch of the present invention which is incorporated into the apparatus of FIG. 3.

FIG. 4 is a circuit diagram showing the switch of the present invention which is incorporated in the transmit/receive coil (i.e., single coil) of the magnetic resonance imaging apparatus. The single coil is made up of inductor 300, equivalent resistor 301 resulting from the coil per se and subject (sample) and variable capacitors 302, 303, 304 and 305 and connected to the preamplifier and receiver.

Here variable capacitor 302 is comprised of a loading capacitor whose capacity is discretely varied, variable capacitors 303, 304 are made up of a matching capacitor and variable capacitor 305 is comprised of a tuning capacitor.

The tuning frequency can be varied by controlling the capacity of variable capacitor 305 to select desired atomic nuclei, that is, an object to be imaged. In this case, variable capacitors 303, 304 and variable capacitor 302 can also be controlled according to the present invention.

This is disclosed in more detail in the document: J. F. Shen and I. J. Low (Physics Department, University of Pittsburgh; Pittsburgh, Pa. 15260; [R. F. Coil Design For NMR Imaging] "Society of Magnetic Resonance in Medicine" (Fourth Annual Meeting, Aug. 19–23, 1985).

Figure 5:
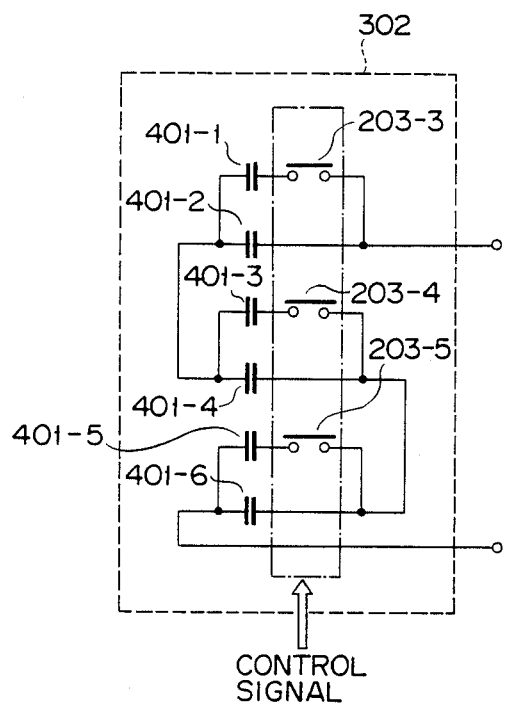
FIG. 5 is a circuit diagram showing a detailed variable capacitor of FIG. 4.

FIG. 5 is a circuit diagram showing the aforementioned shortening capacitor (302). Shortening capacitor 302 is made up of unit capacitors 401-1 to 401-6 and switches (the present invention) 203-3 to 203-5. Upon receipt of a control signal, switches 203-3, 203-4 and 203-5 are opened and closed. A capacitive value can be controlled by a combination of unit capacitors 401-1 to 401-6. In this case, switches 203-3 to 203-5 are placed under a high magnetic field atmosphere because they are incorporated within the receiving coil.

FIG. 6 is a perspective view showing one form of a coaxial switch assembly which may be used, under a high magnetic field atmosphere, in combination with the switch of the present invention.

The coaxial switch is mounted on substrate 500 in which the switch as shown, for example, in FIG. 1 is incorporated. Substrate 500 is of such a type that grounded electrode 502 is bonded to one face of insulating substrate 501 and that strip lines 503, 504 whose characteristic impedance is 50 Ω are bonded to the other face of insulating substrate 501. Housing 1 is mounted on substrate 500 with strip lines 503 and 504 located in a manner to correspond to fixed electrode plates 30 and 40. Grounded electrode plate 60 of a switch, not shown, is connected to grounded electrode plate 502. It is possible to wholly cover the resultant structure, as required. It may be possible to provide a coaxial connector, not shown, relative to the ends (505 and 506) of strip lines 503 and 504.

It is, therefore, possible to provide a high-frequency coaxial switch which can be employed under a high magnetic field atmosphere.

As set out above, according to the present invention, a switch is provided which can close and open the associated electric circuit under a high magnetic field and positively hold the open and closed state. The present invention is not restricted to the aforementioned embodiment and can be changed in a variety of ways without departing from the spirit and scope of the present invention.

What is claimed is:

1. A switch for use in a high magnetic field induced in a high magnetic field generator, including at least one circuit to be switched, comprising:
   driving means, including at least a coil and a non-magnetic element, which are reversibly movable under a mutual electromagnetic atmosphere obtained by flowing electric current in the coil and the high magnetic field;
   opening/closing means having a movable contact and a fixed contact, for closing the circuit by connecting the movable contact to the fixed contact, and opening the circuit by separating the movable contact from the fixed contact; and
   transmitting means located between said driving means and said opening/closing means for transmitting a driving force of said driving means to said opening/closing means to latch the movable and fixed contacts;
   wherein said driving means comprises a rotation shaft mounted within a housing made of non-magnetic material and a coil mounted relative to the rotation shaft which, upon the flow of electric current through the coil, excites said coil under a mutual electromagnetic atmosphere of electric current in the coil and high magnetic force created by said magnetic field generator.

2. A switch according to claim 1, wherein said coil receives electric current from a pair of terminals which are provided outside of said housing.

3. A switch for use in a high magnetic field induced in a high magnetic field generator, including at least one circuit to be switched, comprising:
   driving means, including at least a coil and a non-magnetic element, which are reversibly movable under a mutual electromagnetic atmosphere obtained by flowing electric current in the coil and the high magnetic field;
   opening/closing means having a movable contact and a fixed contact, for closing the circuit by connecting the movable contact to the fixed contact, and opening the circuit by separating the movable contact from the fixed contact; and
   transmitting means located between said driving means and said opening/closing means for transmitting a driving force of said driving means to said opening/closing means to latch the movable and fixed contacts, said transmitting means comprises a hinge for translating a rotation force of said driving means into a linear drive force, an arm energized by the hinge, and a latching/snapping element moved by the arm.

4. A switch according to claim 3, wherein said latching/snapping element is made up of a non-magnetic leaf spring with one end thereof secured to a fixed position and the other end thereof placed in engagement with said opening/closing means.

5. A switch for use in a high magnetic field induced on a high magnetic field generator, including at least one circuit to be switched, comprising:
   driving means, including at least a coil and a non-magnetic element, which are reversibly movable under a mutual electromagnetic atmosphere obtained by flowing electric current in the coil and the high magnetic field;
   opening/closing means having a movable contact and a fixed contact, for closing the circuit by connecting the movable contact to the fixed contact, and opening the circuit by the movable contact separate from the fixed contact; and
   transmitting means made of non-magnetic material, located between said driving means and said opening/closing means for transmitting a driving force of said driving means to said opening/closing means to latch the movable and fixed contacts.

6. A switch for use in a high magnetic field induced in a high magnetic field generator, including at least one circuit to be switched, comprising:
   driving means, including at least a coil and a non-magnetic element, which are reversibly movable under a mutual electromagnetic atmosphere obtained by flowing electric current in the coil and the high magnetic field;
   opening/closing means having a movable contact and a fixed contact, for closing the circuit by connecting the movable contact to the fixed contact, and opening the circuit by separating the movable contact from the fixed contact; and
   transmitting means located between said driving means and said opening/closing means for transmitting a driving force of said driving means to said opening/closing means to latch the movable and fixed contacts;
   wherein said opening/closing means comprises a fixed electrode plate mounted on said housing, a rod linearly driven by said transmitting means and a movable electrode plate movable into engagement with, or away from, the fixed electrode plate, wherein said movable and fixed electrode plates have their ends exposed outside of said housing.

7. A switch for use in a high magnetic field induced in a high magnetic field generator, including at least one circuit to be switched, comprising:
   driving means, including at least a coil and a non-magnetic element, which are reversibly movable under a mutual electromagnetic atmosphere obtained by flowing electric current in the coil and the high magnetic field;
   opening/closing means having a movable contact and a fixed contact, for closing the circuit by connecting the movable contact to the fixed contact, and opening the circuit by separating the movable contact from the fixed contact, wherein said opening/closing means has a fixed contact located on a path connecting a preamplifier and receiving coil of a magnetic resonance imaging apparatus; and
   transmitting means located between said driving means and opening/closing means for transmitting a driving force of said driving means to said opening/closing means to latch the movable and fixed contacts.

8. A switch for use in a high magnetic field induced in a high magnetic field generator, including at least one circuit to be switched, comprising:
   driving means, including at least a coil and a non-magnetic element, which are reversibly movable under a mutual electromagnetic atmosphere obtained by flowing electric current in the coil and the high magnetic field;
   opening/closing means having a movable contact and a fixed contact, for closing the circuit by connecting the movable contact to the fixed contact, and opening the circuit by separating the movable contact from the fixed contact, wherein said opening/closing means has its fixed located on a path of a variable capacitor which is included in a single coil of a magnetic resonance imaging apparatus; and
   transmitting means located between said driving means and said opening/closing means for transmitting a driving force of said driving means to said opening/closing means to latch the movable and fixed contacts.

9. A switch for use in a high magnetic field, comprising:
   a rotation shaft mounted within a housing made of non-magnetic material;
   a coil mounted relative to a rotation shaft and rotatably driven by a mutual electromagnetic atmosphere of that coil current and high magnetic field created from a high magnetic field generator;
   a hinge for translating a rotation force of the coil into a linear motion;
   an arm which is urged by the hinge;
   a rod driven by the arm;
   a latching/snapping element urged by the rod;
   fixed electrode mounted on the housing; and
   a movable electrode plate mounted on the rod and movable into engagement with, and away from, the fixed electrode plate.

10. A switch for use in a high magnetic field induced in a high magnetic field generator, including at least one circuit to be switched, comprising:
    driving means, including at least a coil and a non-magnetic element, which are reversibly movable under a mutual electromagnetic atmosphere obtained by flowing electric current in the coil and the high magnetic field, wherein said driving means comprises a first non-magnetic rod placed in alignment with a direction of a static magnetic field developed from a high-intensity static magnetic field generator and a solenoid coil fixedly turned around an end portion of the first non-magnetic rod;
    opening/closing means having a movable contact and a fixed contact, for closing the circuit by connecting the movable contact to the fixed contact, and opening the circuit by separating the movable contact from the fixed contact; and
    transmitting means located between said driving means and said opening/closing means for transmitting a driving force of said driving means to said opening/closing means to latch the movable and fixed contacts.

11. A switch for use in a high magnetic field induced in a high magnetic field generator, including at least one circuit to be switched, comprising:
    driving means, including at least a coil and a non-magnetic element, which are reversibly movable under a mutual electromagnetic atmosphere obtained by flowing electric current in the coil and the high magnetic field;
    opening/closing means having a movable contact and a fixed contact, for closing the circuit by connecting the movable contact to the fixed contact, and opening the circuit by separating the movable contact from the fixed contact, wherein said opening/closing means comprises a second non-magnetic rod energized by said driving means, a movable contact provided on an end portion of the second non-magnetic rod and a fixed contact movable into engagement with, and away from, the movable contact; and
    transmitting means located between said driving means and said opening/closing means for transmitting a driving force of said driving means to said opening/closing means to latch the movable and fixed contacts.

12. A switch for use in a high magnetic field induced in a high magnetic field generator, including at least one circuit to be switched, comprising:
    driving means, including at least a coil and a non-magnetic element, which are reversibly movable under a mutual electromagnetic atmosphere obtained by flowing electric current in the coil and the high magnetic field;
    opening/closing means having a movable contact and a fixed contact, for closing the circuit by connecting the movable contact to the fixed contact, and opening the circuit by separating the movable contact from the fixed contact; and
    transmitting means located between said driving means and said opening/closing means for transmitting a driving force of said driving means to said opening/closing means to latch the movable and fixed contacts; wherein said transmitting means connects said driving means to said opening/closing means in a projection/recess relation.

13. A switch for use in a high magnetic field, comprising:
    a rotation shaft mounted within a housing made of non-magnetic material;
    a coil mounted relative to the rotation shaft and rotatably driven upon receipt of a mutual magnetic atmosphere of electric current in the coil and high magnetic field which is developed from a high magnetic field generator;
    a hinge for translating a rotation drive of the coil into a linear motion;
    an arm energized by the hinge;
    a rod driven by the arm;
    a latching/snapping element which is urged by the rod;
    a fixed electrode plate mounted relative to the housing;
    a movable electrode plate mounted on the rod and movable into and out of engagement with the fixed electrode plate; and
    a substrate having a strip fixed to the fixed electrode plate and on which said housing is mounted.

* * * * *